(12) United States Patent
Lai et al.

(10) Patent No.: US 12,272,662 B2
(45) Date of Patent: Apr. 8, 2025

(54) SEMICONDUCTOR STRUCTURE

(71) Applicant: UNITED MICROELECTRONICS CORPORATION, Hsinchu (TW)

(72) Inventors: Chien-Ming Lai, Tainan (TW); Zhi-Rui Sheng, Singapore (SG); Hui-Ling Chen, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 568 days.

(21) Appl. No.: 17/739,213

(22) Filed: May 9, 2022

(65) Prior Publication Data

US 2022/0262752 A1 Aug. 18, 2022

Related U.S. Application Data

(63) Continuation-in-part of application No. 17/064,609, filed on Oct. 7, 2020, now Pat. No. 11,355,431.

(51) Int. Cl.
| | |
|---|---|
| *H01L 23/522* | (2006.01) |
| *H01L 23/00* | (2006.01) |
| *H10D 1/20* | (2025.01) |
| *H10D 1/47* | (2025.01) |
| *H10D 1/68* | (2025.01) |

(52) U.S. Cl.
CPC ............... *H01L 24/08* (2013.01); *H10D 1/20* (2025.01); *H10D 1/47* (2025.01); *H10D 1/68* (2025.01); *H01L 2224/08145* (2013.01); *H01L 2924/1205* (2013.01); *H01L 2924/1206* (2013.01); *H01L 2924/1207* (2013.01)

(58) Field of Classification Search
CPC ............. H01L 23/5227; H01L 23/5228; H01L 23/5223; H01L 24/08; H01L 24/80; H10D 1/20; H10D 1/47; H10D 1/68
See application file for complete search history.

(56) References Cited

U.S. PATENT DOCUMENTS

| | | | | |
|---|---|---|---|---|
| 5,583,359 | A | * | 12/1996 | Ng .......................... H01L 28/91 257/532 |
| 6,266,226 | B1 | | 7/2001 | Hayashi |
| 6,445,056 | B2 | | 9/2002 | Nakashima |
| 6,597,562 | B1 | * | 7/2003 | Hu .......................... H01L 28/82 257/532 |
| 6,635,916 | B2 | | 10/2003 | Aton |
| 6,980,414 | B1 | | 12/2005 | Sutardja |

(Continued)

*Primary Examiner* — Omar F Mojaddedi

(57) ABSTRACT

A semiconductor structure includes a first layer, a second layer, a first interconnection layer, and a second interconnection layer. The first layer includes an upper passive component pattern, and the second layer includes a lower passive component pattern, wherein the upper passive component pattern is opposite to the lower passive component pattern. The first interconnection layer includes at least one first interconnect structure electrically connected on the upper passive component pattern. The second interconnection layer includes at least one second interconnect structure electrically connected on the passive component pattern. The first interconnect structure on the upper passive component pattern is hybrid bonded with the second interconnect structure on the lower passive component pattern. Therefore, the upper passive component pattern and the lower passive component pattern are joined by hybrid bonding to form a passive device.

8 Claims, 8 Drawing Sheets

(56) References Cited

U.S. PATENT DOCUMENTS

| | | | |
|---|---|---|---|
| 10,290,571 B2 | 5/2019 | Yu et al. | |
| 2006/0112765 A1* | 6/2006 | Malvern | G01P 1/006 |
| | | | 73/514.32 |
| 2007/0291439 A1* | 12/2007 | Yeh | H10D 1/692 |
| | | | 257/E27.048 |
| 2018/0315548 A1* | 11/2018 | Wang | H01L 23/5223 |
| 2020/0043874 A1* | 2/2020 | Sira | H01L 23/4824 |
| 2020/0135842 A1* | 4/2020 | Chen | H01L 28/60 |

* cited by examiner

SEMICONDUCTOR STRUCTURE

CROSS-REFERENCE TO RELATED APPLICATION

This application is a continuation-in-part of U.S. application Ser. No. 17/064,609, filed Oct. 7, 2020, the entire contents of which are incorporated herein by reference.

FIELD OF THE INVENTION

The present invention relates to a semiconductor structure, and more particularly to a semiconductor structure with a capacitor element formed by hybrid bonding.

BACKGROUND OF THE INVENTION

Three-dimensional semiconductor components are formed by stacking semiconductor wafers (or semiconductor substrates) or dies, wherein copper-copper (Cu—Cu) connections or through-silicon vias (TSV), for example, are used to form electrical connections in the vertical direction. Compared with the traditional planar manufacturing process, three-dimensional semiconductor devices can not only reduce occupied areas, but also reduce power loss and obtain improved performance to achieve performance improvement.

A Cu-to-Cu bonding technology currently used in the semiconductor wafers (or substrates) refers to a process of coating a macromolecular dielectric layer fully on bonding surfaces of two semiconductor wafers (or substrates) before bonding the two semiconductor wafers (or substrates). Next, a pose cure is performed on the macromolecular dielectric layer so that the macromolecular dielectric layer is fully filled in gaps between Cu-to-Cu bonding surfaces. In this way, a hybrid bonding may then be achieved by a metal-to-metal bonding (i.e., the Cu-to-Cu bonding) and a dielectric layer-to-dielectric layer bonding.

Among various technologies for stacking semiconductor substrates, hybrid bonding technology is currently a project that the industry pays attention to and is actively developed because it can form a high-density electrical connection structure.

SUMMARY OF THE INVENTION

The present invention provides a semiconductor structure, wherein a passive device is formed in the semiconductor stacked structure by hybrid bonding, and thereby the passive device may produce required electrical values.

In order to achieve one or a portion of or all of the objects or other objects, an embodiment of the invention provides a semiconductor structure including a first layer, a second layer, a first interconnection layer, and a second interconnection layer. The first layer includes a first passive component pattern. The second layer is spaced apart from the first layer, and the second layer includes a second passive component pattern. The first interconnection layer is disposed on one side of the first layer facing the second layer, and the first interconnection layer includes a first dielectric material and at least one first interconnect structure electrically connected on the first passive component pattern. The second interconnection layer is disposed on one side of the second layer facing the first layer, and the second interconnection layer includes a second dielectric material and at least one second interconnect structure electrically connected on the second passive component pattern, wherein the at least one first interconnect structure on the first passive component pattern is hybrid bonded with the at least one second interconnect structure on the second passive component pattern. A bonding interface is between the first interconnection layer and the second interconnection layer, wherein the at least one first interconnect structure is in contact with the at least one second interconnect structure at the bonding interface, and the first dielectric material is in contact with the second dielectric material at the bonding interface.

In one embodiment of the invention, the first passive component pattern and the second passive component pattern are resistance patterns.

In one embodiment of the invention, the first passive component pattern and the second passive component pattern are respectively a first inductance pattern and a second inductance pattern.

In one embodiment of the invention, the first inductance pattern has an input terminal and a first connection terminal, and the second inductance pattern has a second connection terminal and an output terminal, wherein the at least one first interconnect structure is electrically connected to the first connection terminal, the at least one second interconnect structure is electrically connected to the second connection terminal, and the first inductance pattern, the at least one first interconnect structure, the second inductance pattern and the at least one second interconnect structure form a continuous and non-intersecting path between the input terminal and the output terminal and constitute an inductor.

In one embodiment of the invention, the first inductance pattern includes a first coil spiraling inward from the input terminal to the first connection terminal, and the second inductance pattern includes a second coil spiraling outward from the second connection terminal to the output terminal.

In one embodiment of the invention, the first inductance pattern comprises a first coil spiraling outward from the input terminal to the first connection terminal, and the second inductance pattern comprises a second coil spiraling inward from the second connection terminal to the output terminal.

In one embodiment of the invention, the number of the at least one first interconnect structure is the same as the number of the at least one second interconnect structure.

In one embodiment of the invention, the at least one first interconnect structure and the at least one second interconnect structure are pads, via contacts, or combinations thereof.

According to the embodiments of the present invention, the semiconductor structure includes a passive device formed in the semiconductor stacked structure by hybrid bonding. Since the first passive component pattern and the second passive component pattern are joined by hybrid bonding to form the passive device, the passive device may produce the required electrical values by adjusting the design of the first passive component pattern and the second passive component pattern.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
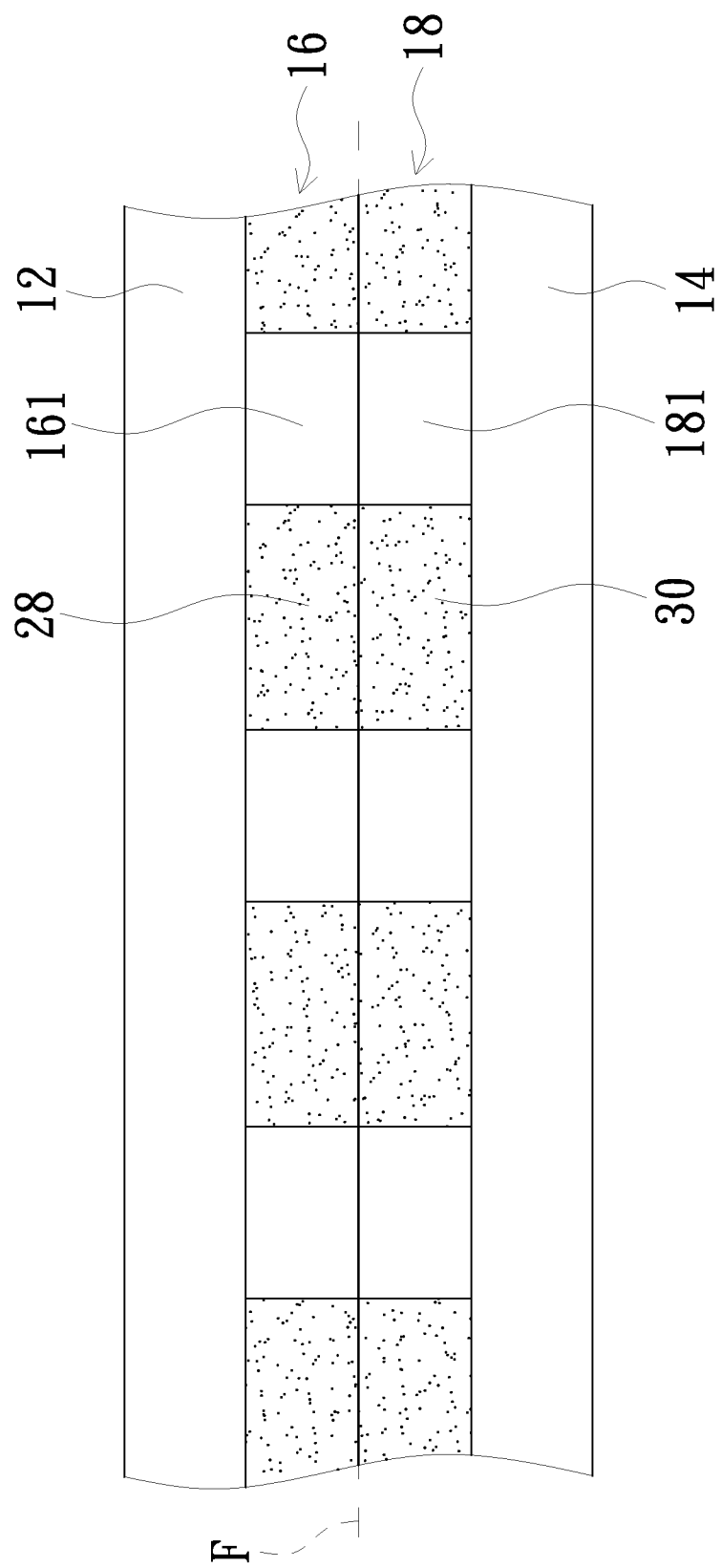
FIG. 1 is a schematic cross-sectional diagram of a semiconductor structure according to an embodiment of the present invention.
Figure 2:
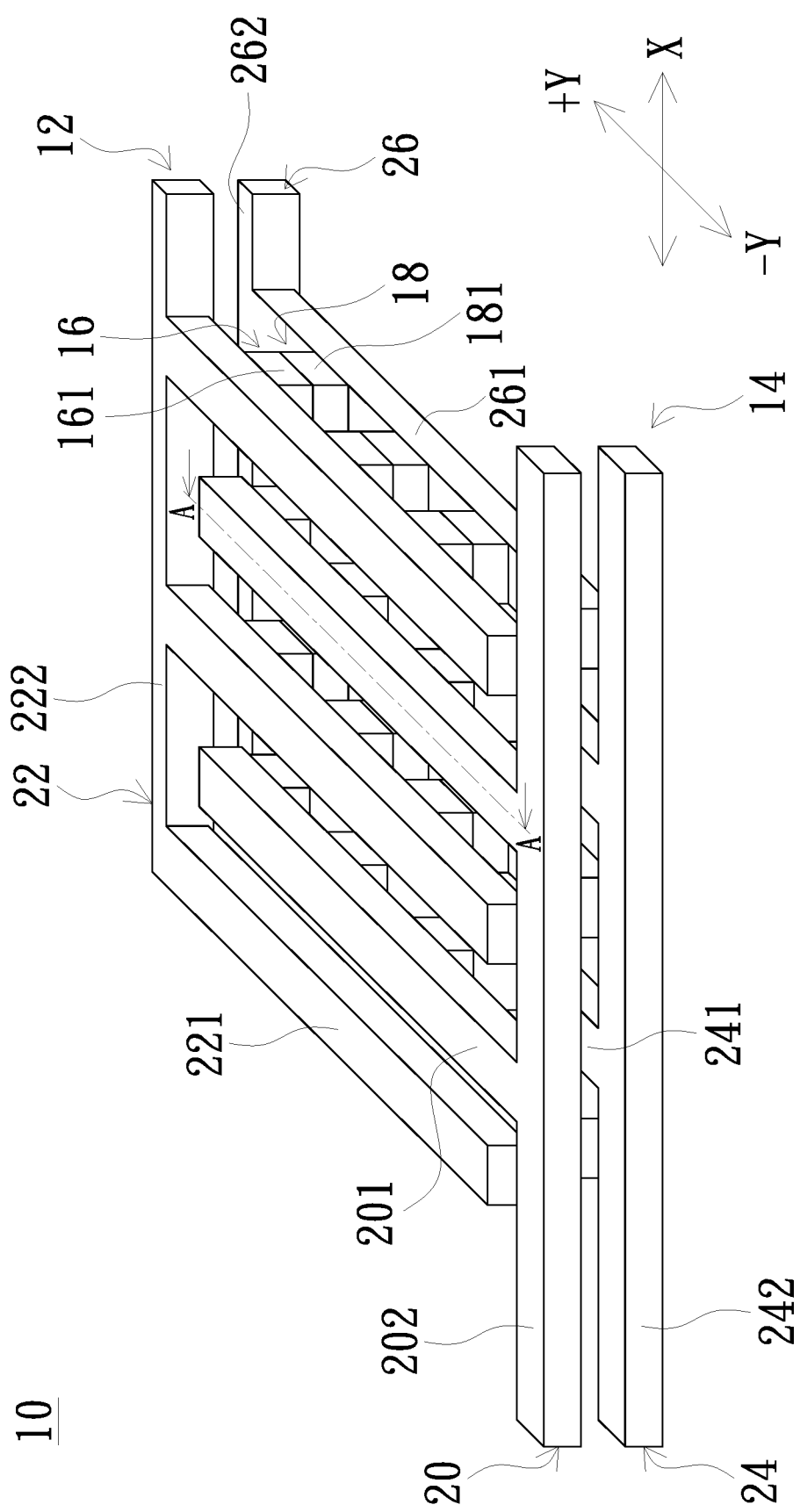
FIG. 2 is a three-dimensional schematic diagram of a semiconductor structure according to an embodiment of the present invention.

FIG. 1 is a schematic cross-sectional diagram of a semiconductor structure according to an embodiment of the present invention. FIG. 2 is a three-dimensional schematic diagram of a semiconductor structure according to an embodiment of the present invention. The semiconductor structure includes, for example, a capacitor element formed in the semiconductor stacked structure, wherein the capacitor element is formed by hybrid bonding. As shown in FIG. 1, the semiconductor structure 10 includes a first layer 12, a second layer 14, a first interconnection layer 16 and a second interconnection layer 18. In one embodiment, the first layer 12 and the second layer 14 may be two inner layers within the semiconductor stacked structure, and the second layer 14 are spaced apart from and opposite to the first layer 12.

As shown in FIG. 2, the first layer 12 includes a first electrode pattern 20 and a second electrode pattern 22, and the first electrode pattern 20 and the second electrode pattern 22 are isolated from each other. The second layer 14 includes a third electrode pattern 24 and a fourth electrode pattern 26, and the third electrode pattern 24 and the fourth electrode pattern 26 are isolated from each other. The first electrode pattern 20 is opposite to the third electrode pattern 24, the second electrode pattern 22 is opposite to the fourth electrode pattern 26, and by the arrangements of the first interconnection layer 16 and the second interconnection layer 18, the first electrode pattern 20 and the third electrode pattern 24 form a hybrid bonding, and the second electrode pattern 22 and the fourth electrode pattern 26 form a hybrid bonding. In one embodiment, the first electrode pattern 20 and the second electrode pattern 22 have different electric potentials, or the third electrode pattern 24 and the fourth electrode pattern 26 have different electric potentials, whereby a capacitor element is formed by the first electrode pattern 20, the second electrode pattern 22, the third electrode pattern 24 and the fourth electrode pattern 26.

Following the above description, as shown in FIG. 1 and FIG. 2, the first interconnection layer 16 is disposed on one side of the first layer 12 facing the second layer 14, and the first interconnection layer 16 includes a plurality of first interconnect structures 161. The second interconnection layer 18 is disposed on one side of the second layer 14 facing the first layer 12, and the second interconnection layer 18 includes a plurality of second interconnect structures 181. The plurality of first interconnect structures 161 are formed on the first electrode pattern 20 and the second electrode pattern 22, and are electrically connected with the first electrode pattern 20 and the second electrode pattern 22. The plurality of second interconnect structures 181 are formed on the third electrode pattern 24 and the fourth electrode pattern 26, and are electrically connected with the third electrode pattern 24 and the fourth electrode pattern 26. In one embodiment, the first interconnect structures 161 and the second interconnect structures 181 may be pads, via contacts, or combinations thereof, for example. The first interconnect structures 161 and the second interconnect structures 181 may include conductive materials, including but not limited to W, Co, Cu, Al, silicide or any combination thereof.

In one embodiment, the number of the first interconnect structures 161 is the same as the number of the second interconnect structures 181, and the distribution of the first interconnect structures 161 on the first electrode pattern 20 and the second electrode pattern 22 corresponds to the distribution of the second interconnect structures 181 on the third electrode pattern 24 and the fourth electrode pattern 26. The first interconnect structures 161 on the first electrode pattern 20 are bonded with the second interconnect structures 181 on the third electrode pattern 24, and the first interconnect structures 161 on the second electrode pattern 22 are bonded with the second interconnect structures 181 on the fourth electrode pattern 26. In one embodiment, there is a bonding interface F between the first interconnection layer 16 and the second interconnection layer 18, wherein the first interconnect structures 161 are in contact with the second interconnect structures 181 at the bonding interface F.

As shown in FIG. 1, the first interconnection layer 16 may further include a first dielectric material 28 (not shown in FIG. 2) and the second interconnection layer 18 may further include a second dielectric material 30 (not shown in FIG. 2), wherein the first dielectric material 28 and the second dielectric material 30 may be one or more ILD layers or IMD layers, the first interconnect structures 161 are formed in the first dielectric material 28, and the second interconnect structures 181 are formed in the second dielectric material 30. The first interconnect structures 16/second interconnect structures 18 may be formed in the first dielectric material 28/second dielectric material 30 through a single patterning process, for example, a lithography process. As shown in FIG. 1, the first dielectric material 28 is also in contact with the second dielectric material 30 at the bonding interface F. The first dielectric material 28 and the second dielectric material 30 include, but are not limited to, silicon oxide, silicon nitride, silicon oxynitride, low-dielectric-constant (low-k) dielectric materials, or any combination thereof.

Hybrid bonding is a direct bonding technology, such as a surface bonding technology that does not use an intermediate layer (such as solder or adhesive), and can simultaneously obtain a metal-metal bonding structure (i.e. the first interconnect structures and the second interconnect structures are bonded) and a dielectric material-dielectric material bonding structure. As shown in FIG. 2, due to the formation of the first interconnection layer 16 and the second interconnection layer 18, the first electrode pattern 20 and the third electrode pattern 24 form a hybrid bonding, and the second electrode pattern 22 and the fourth electrode pattern 26 form a hybrid bonding.

Figure 3:
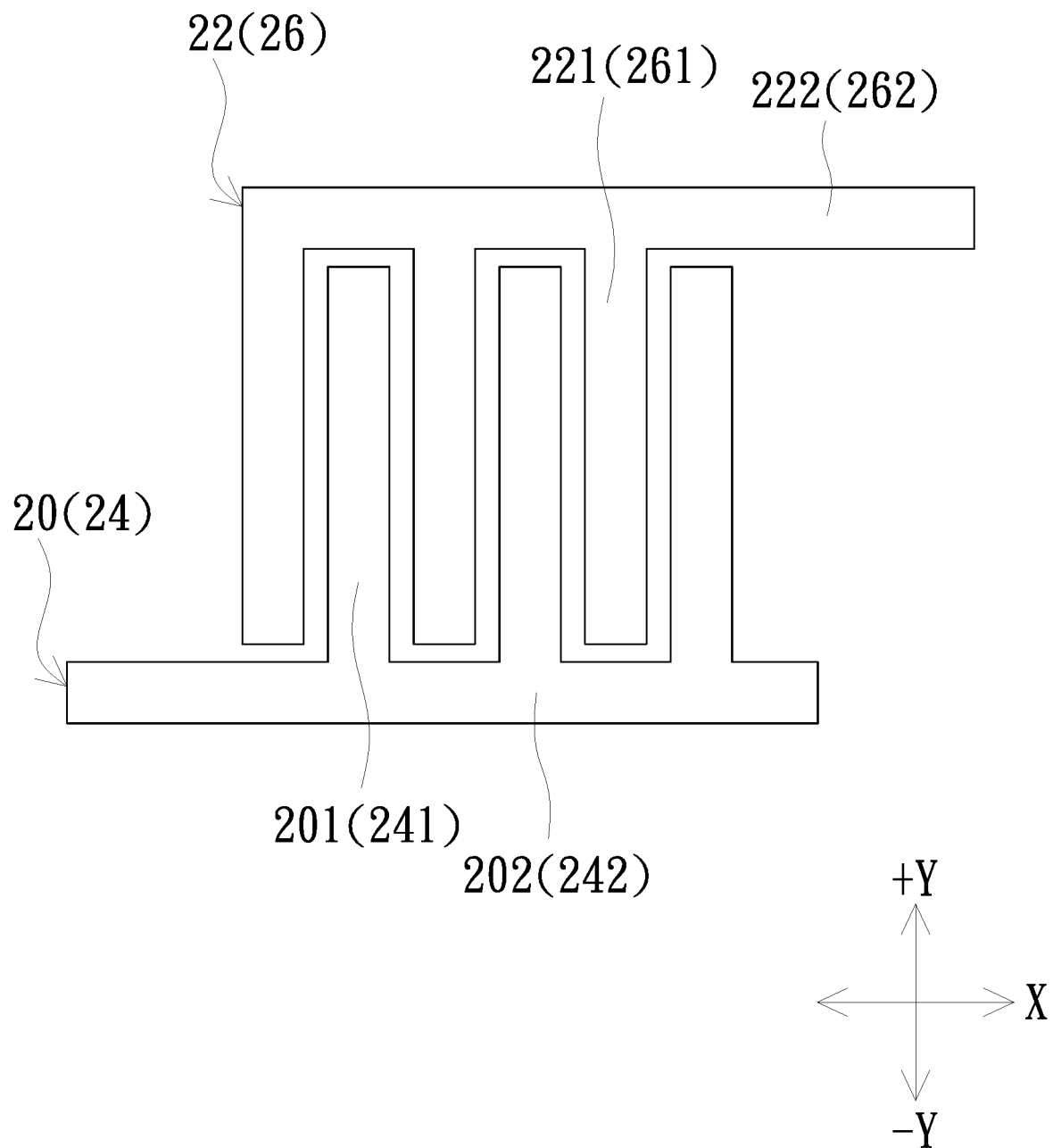
FIG. 3 is a schematic top view of the first electrode pattern and the second electrode pattern according to an embodiment of the present invention.

FIG. 3 is a schematic top view of the first electrode pattern and the second electrode pattern according to an embodiment of the present invention. Correspondingly, FIG. 3 can also be a schematic top view of the third electrode pattern and the fourth electrode pattern. In one embodiment, as shown in FIG. 3, the first electrode pattern 20 includes a plurality of first teeth 201 arranged at intervals and a first connecting portion 202 connecting the plurality of first teeth 201, the second electrode pattern 22 includes a plurality of second teeth 221 arranged at intervals and a second connecting portion 222 connecting the plurality of second teeth 221. In one embodiment, the first connecting portion 202 and the second connecting portion 222 are along a first direction, such as an X direction, and the first teeth 201 and the second teeth 221 are along a second direction, such as a Y direction, wherein the first teeth 201 may extend toward +Y direction from the first connecting portion 202 and the second teeth 221 may extend toward −Y direction from the second connecting portion 222. In the arrangement of the first electrode pattern 20 and the second electrode pattern 22, the plurality of first teeth 201 and the plurality of second teeth 221 may be arranged in a mutually staggered fashion from opposite directions.

Correspondingly, as shown in FIG. 3, the third electrode pattern 24 includes a plurality of third teeth 241 arranged at intervals and a third connecting portion 242 connecting the plurality of third teeth 241, the fourth electrode pattern 26 includes a plurality of fourth teeth 261 arranged at intervals and a fourth connecting portion 262 connecting the plurality of fourth teeth 261. As shown in FIG. 2 and FIG. 3, the third connecting portion 242 and the fourth connecting portion 262 correspond to the first connecting portion 202 and the second connecting portion 222 respectively, and are along the first direction, such as the X direction. The third teeth 241 correspond to the first teeth 201, the fourth teeth 261 correspond to the second teeth 221, the third teeth 241 may extend toward +Y direction from the third connecting portion 242, and the fourth teeth 261 may extend toward −Y direction from the fourth connecting portion 262. In the arrangement of the third electrode pattern 24 and the fourth electrode pattern 26, the plurality of third teeth 241 and the plurality of fourth teeth 261 may be arranged in a mutually staggered fashion from opposite directions.

As shown in FIG. 2, the plurality of first interconnect structures 161 are disposed on the first teeth 201 and the second teeth 221, and the plurality of second interconnect structures 181 are disposed on the third teeth 241 and the fourth teeth 261. Each of the first interconnect structures 161 on the first teeth 201 and the second teeth 221 is opposite to and bonded with each of the second interconnect structures 181 on the third teeth 241 and the fourth teeth 261.

In one embodiment, the first connecting portion 202 and the third connecting portion 242 are electrically connected to a first voltage, the second connecting portion 222 and the fourth connecting portion 262 are electrically connected to a second voltage, and the first voltage is different from the second voltage, so that the first electrode pattern 20 and the second electrode pattern 22 have different electric potentials, and/or the third electrode pattern 24 and the fourth electrode pattern 26 have different electric potentials. By arrangements of the first interconnection layer 16 and the second interconnection layer 18, the first electrode pattern 20 and the third electrode pattern 24 form a hybrid bonding, and the second electrode pattern 22 and the fourth electrode pattern 26 form a hybrid bonding, so that a capacitor element is formed by the first electrode pattern 20, the second electrode pattern 22, the third electrode pattern 24 and the fourth electrode pattern 26.

Figure 4:
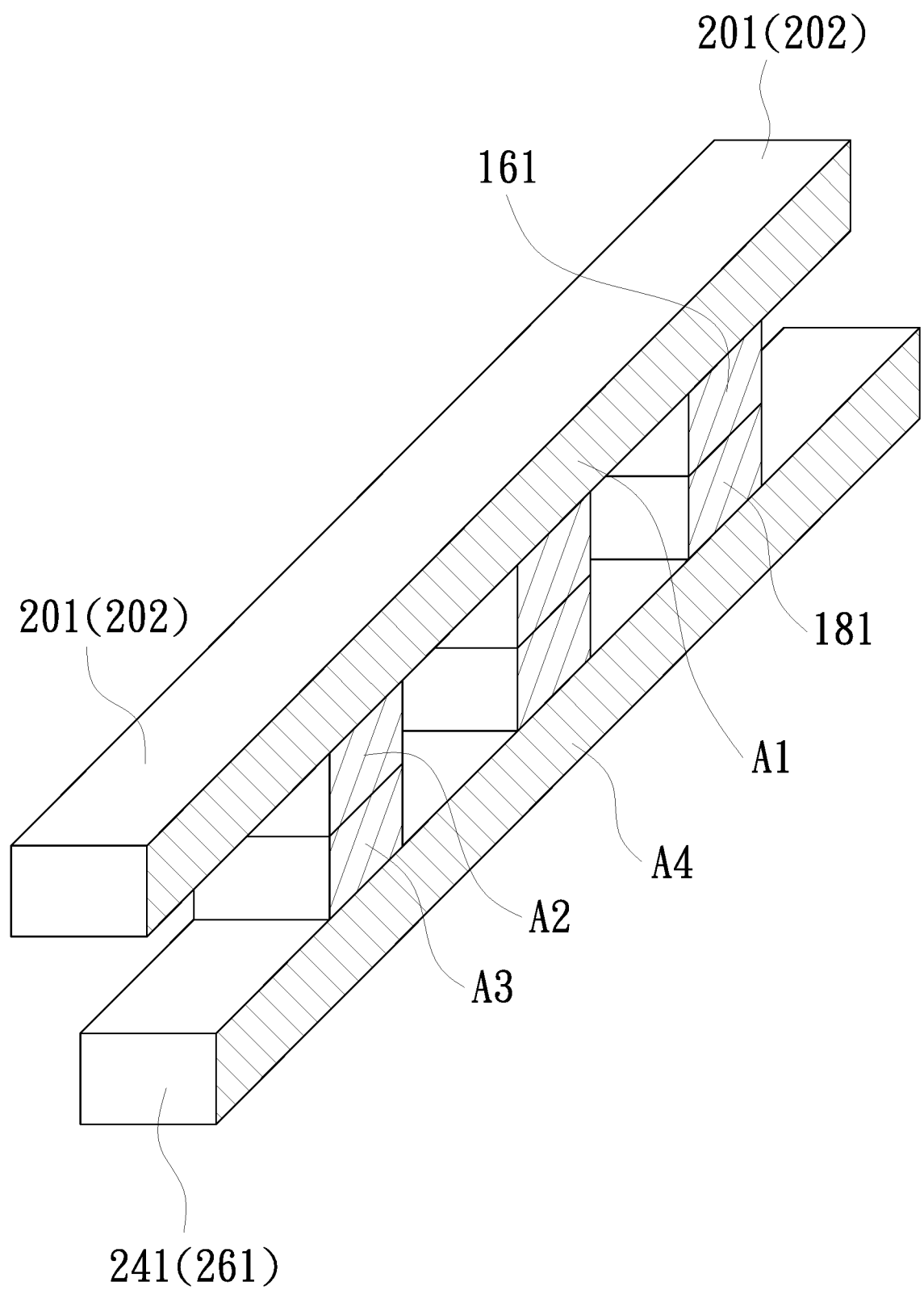
FIG. 4 is a schematic cross-sectional view of the AA line segment shown in FIG. 2.

FIG. 4 is a schematic cross-sectional view of the AA line segment shown in FIG. 2. In one embodiment of the present invention, all of the cross section area A1 of the upper teeth (such as the first teeth 201 and the second teeth 221), the cross section area A2 of the first interconnect structures 161, the cross section area A3 of the second interconnect structures 181, and the cross section area A4 of the lower teeth (such as the third teeth 241 and the fourth teeth 261) dominate capacitor charge, and the capacitor density is dominated by teeth space, length, density of interconnect structures and the cross section area of the interconnect structures. In one embodiment of the present invention, since the upper electrode patterns (such as the first electrode pattern 20 and the second electrode pattern 22) and lower electrode patterns (such as the third electrode pattern 24 and the fourth electrode pattern 26) are joined by hybrid bonding to form a capacitor element, the capacitor element can improve the charge accumulation effect through the vertical cross section areas A1, A2, A3, A4 of the electrode patterns 20, 22, 24, 26 and the upper and lower interconnection structures 161, 181.

Figure 5:
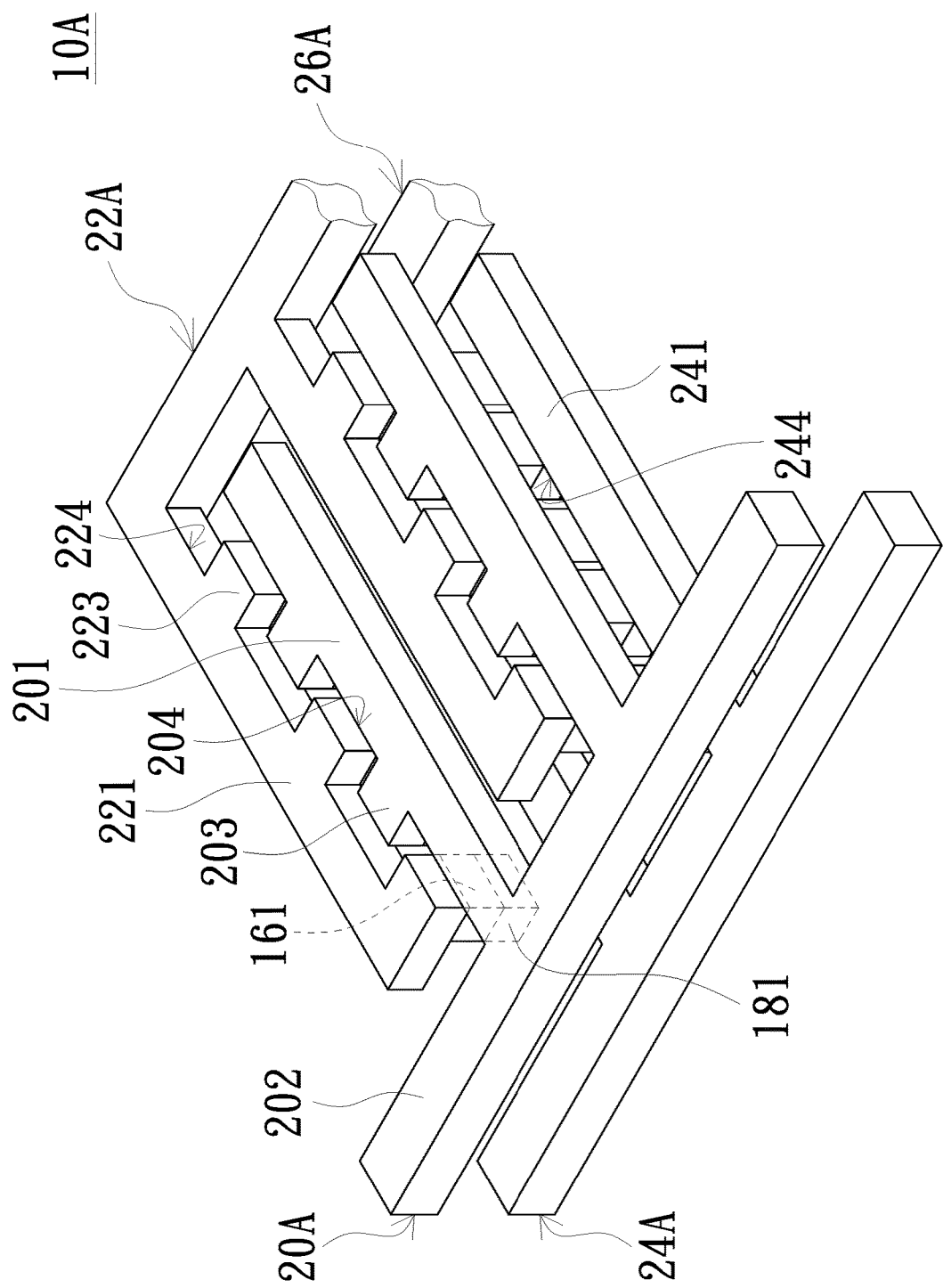
FIG. 5 is a three-dimensional schematic diagram of a semiconductor structure according to another embodiment of the present invention.

FIG. 5 is a three-dimensional schematic diagram of a semiconductor structure according to another embodiment of the present invention. As shown in FIG. 5, the main difference between the semiconductor structure 10A shown in FIG. 5 and the semiconductor structure 10 shown in FIG. 2 is that the first electrode pattern 20A further includes a plurality of first protrusions 203 arranged at intervals on a first side surface 204 of each of the first teeth 201, the second electrode pattern 22A further includes a plurality of second protrusions 223 arranged at intervals on a second side surface 224 of each of the second teeth 221, wherein the first side surface 204 and the second side surface 224 are opposite, and the first protrusions 203 and the second protrusions 223 are arranged in a staggered manner. Correspondingly, the third electrode pattern 24A further includes a plurality of third protrusions (not labeled in the figure) arranged at intervals on a third side surface 244 of each of the third teeth 241 and the fourth electrode pattern 26A further includes a plurality of fourth protrusions (not labeled in the figure) arranged at intervals on a fourth side surface (not labeled in the figure) of each of the fourth teeth (not labeled in the figure), wherein the third side surface 244 and the fourth side surface are opposite, and the third protrusions and the fourth protrusions are arranged in a staggered manner. In one embodiment, the first interconnect structures 161 are respectively disposed on the first protrusions 203 and the second protrusions 223, and the second interconnect structures 181 are respectively disposed on the third protrusions and the fourth protrusions.

According to the embodiments of the present invention, the semiconductor structure includes a capacitor element formed in the semiconductor stacked structure, and the capacitor element is formed by hybrid bonding. Since the upper electrode patterns and the lower electrode patterns are joined by hybrid bonding to form a capacitor element, the capacitor element can improve the charge accumulation effect through the vertical cross section areas of the electrode pattern and the upper and lower interconnection structures.

Figure 6:
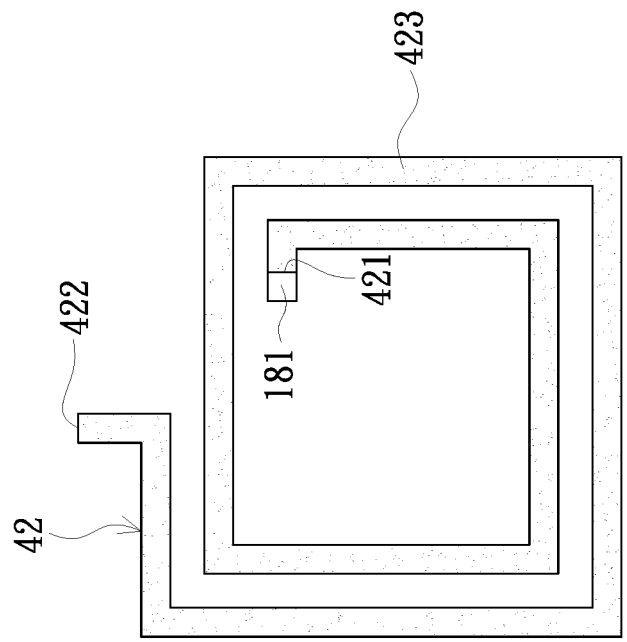
FIG. 6 is a schematic diagram of the configuration of the two passive component patterns and the interconnect structures according to another embodiment of the present invention.
Figure 6:
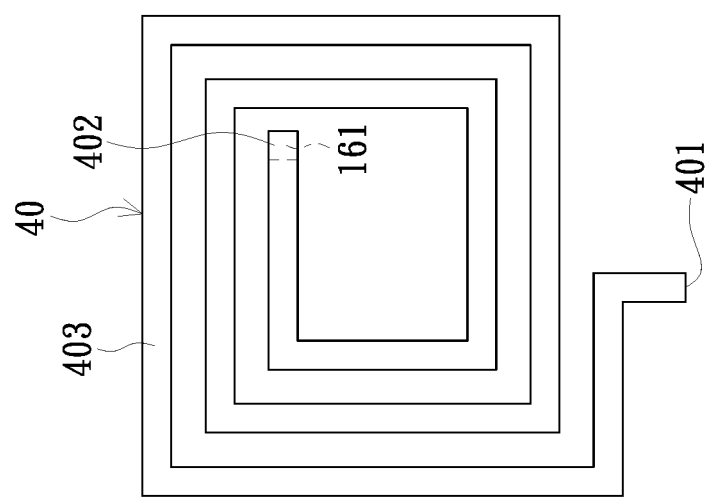

In another embodiment, the first layer 12 (labeled in FIG. 1) may include a first passive component pattern and the second layer 14 (labeled in FIG. 1) may include a second passive component pattern. FIG. 6 is a schematic diagram of the configuration of the two passive component patterns and the interconnect structures according to another embodiment of the present invention. As shown in FIG. 6, the first passive component pattern 40 and the second passive component pattern 42 are respectively a first inductance pattern and a second inductance pattern, for example.

Continue the above description, the first passive component pattern 40 (the first inductance pattern, for example) has an input terminal 401, a first connection terminal 402, and a first coil 403 that spirals inward from the input terminal 401 to the first terminal 402, for example. The second passive component pattern 42 (the second inductance pattern, for example) has a second connection terminal 421, an output terminal 422, and a second coil 423 that spirals outward from the second connection terminal 421 to the output terminal 422, for example. The shape of the first coil 403 roughly corresponds to the shape of the second coil 423. The first interconnect structure 161 is provided at the first connection terminal 402 of the first passive component pattern 40, and the second interconnect structure 181 is provided at the second connection terminal 421 of the second passive component pattern 42.

Figure 7:
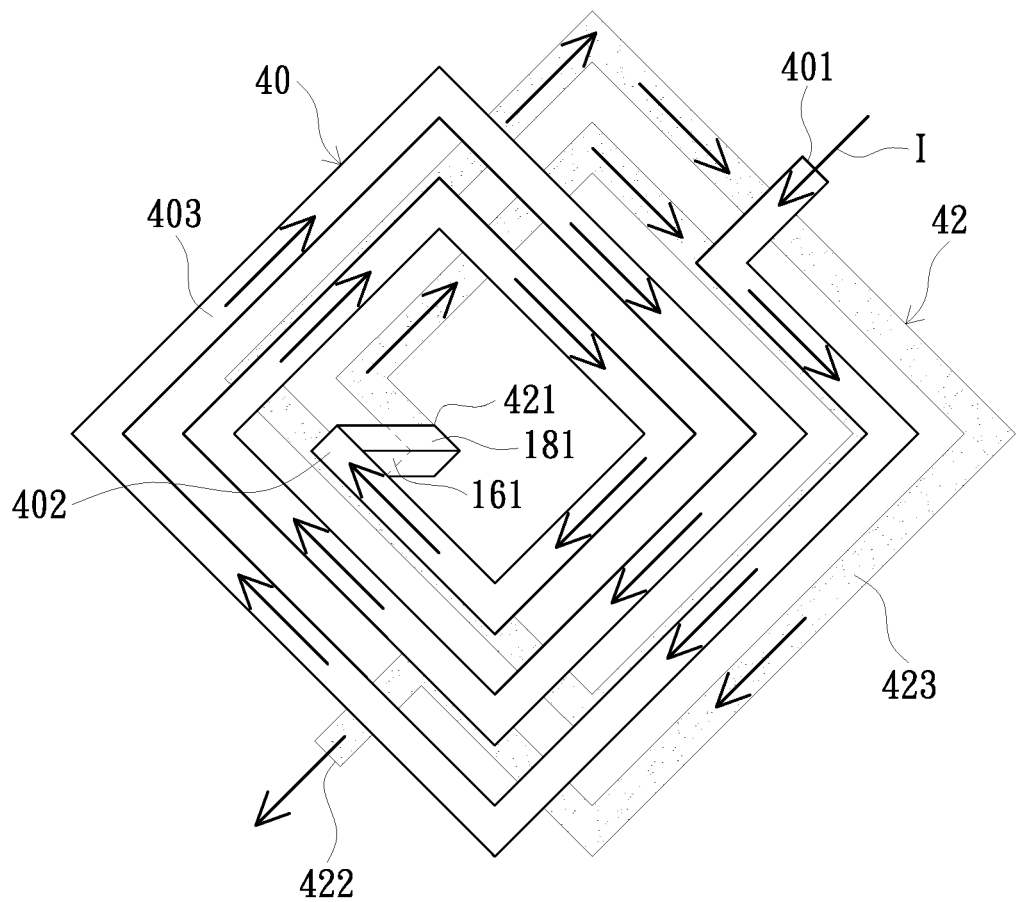
FIG. 7 is a schematic diagram of the two passive component patterns shown in FIG. 6 after bonding.

FIG. 7 is a schematic diagram of the two passive component patterns shown in FIG. 6 after bonding. After the first layer 12 (labeled in FIG. 1) and the second layer 14 (labeled in FIG. 1) are hybrid bonded, the first interconnect structure 161 and the second interconnect structure 181 are bonded as shown in FIG. 7, and further the first dielectric material 28 and the second dielectric material 30 are bonded as shown in FIG. 1. By the bond of the first interconnect structure 161 and the second interconnect structure 181, the first coil 403 and the second coil 423 constitute an inductor, for example. The input terminal 401 and the output terminal 422 are respectively functioned as the input terminal and the output terminal of the inductor. In an embodiment, the currents in the first coil 403 and the second coil 423 have the same current flow direction I.

In the above-mentioned embodiments as shown in FIGS. 6-7, the first coil 403 spirals inward from the input terminal 401 to the first connection terminal 402, and the second coil 423 spirals outward from the second connection terminal 421 to the output terminal 422, so as to form a bond between the inner circle end of the first coil 403 and the inner circle end of the second coil 423; however, the invention is not limited thereto. In an embodiment not shown, the first coil 403 may spiral outward from the input terminal 401 to the first connection terminal 402, and the second coil 423 may spiral inward from the second connection terminal 421 to the output terminal 422, that is, the first interconnect structure 161 and the second interconnect structure 181 form a bond at the outer circle end of the first coil 403 and the outer circle end of the second coil 423.

Figure 8:
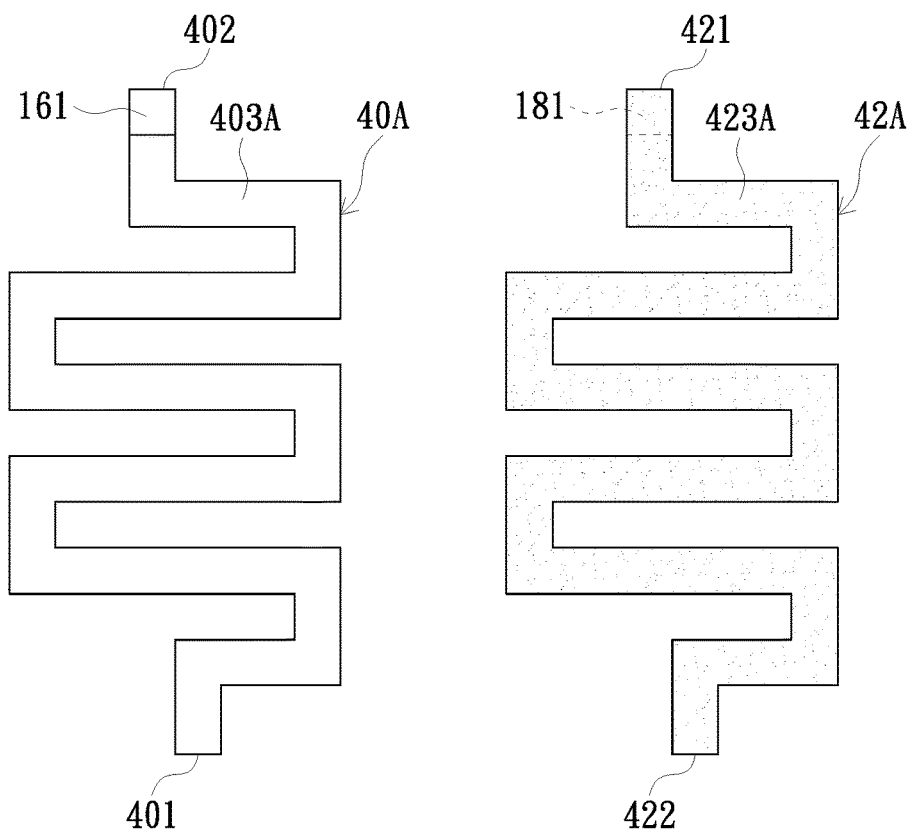
FIG. 8 is a schematic diagram of the configuration of the two passive component patterns and the interconnect structures according to another embodiment of the present invention.

FIG. 8 is a schematic diagram of the configuration of the two passive component patterns and the interconnect structures according to another embodiment of the present invention. As shown in FIG. 8, the first passive component pattern 40A and the second passive component pattern 42A are respectively a first resistance pattern and a second resistance pattern, for example.

Continue the above description, the first passive component pattern 40A (the first resistance pattern, for example) has an input terminal 401, a first connection terminal 402, and a first meander line 403A that extends from the input terminal 401 to the first terminal 402, for example. The second passive component pattern 42A (the second resistance pattern, for example) has a second connection terminal 421, an output terminal 422, and a second meander line 423A that extends from the second connection terminal 421 to the output terminal 422, for example. The shape of the first meander line 403A roughly corresponds to the shape of the second meander line 423A. The first interconnect structure 161 is provided at the first connection terminal 402 of the first passive component pattern 40, and the second interconnect structure 181 is provided at the second connection terminal 421 of the second passive component pattern 42.

Figure 9:
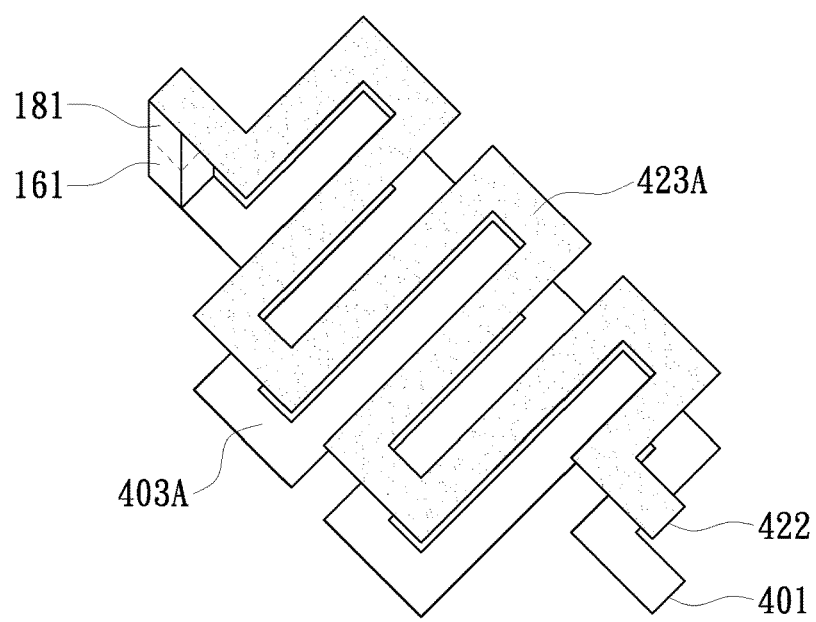
FIG. 9 is a schematic diagram of the two passive component patterns shown in FIG. 8 after bonding.

FIG. 9 is a schematic diagram of the two passive component patterns shown in FIG. 8 after bonding. After the first layer 12 (labeled in FIG. 1) and the second layer 14 (labeled in FIG. 1) are hybrid bonded, the first interconnect structure 161 and the second interconnect structure 181 are bonded as shown in FIG. 9, and further the first dielectric material 28 and the second dielectric material 30 are bonded as shown in FIG. 1. By the bond of the first interconnect structure 161 and the second interconnect structure 181, the first meander line 403 and the second meander line 423A constitute a resistor, for example. The input terminal 401 and the output terminal 422 are respectively functioned as the input terminal and the output terminal of the resistor.

According to the embodiments of the present invention, the semiconductor structure includes a passive device formed in the semiconductor stacked structure by hybrid bonding. Since the first passive component pattern and the second passive component pattern are joined by hybrid bonding to form the passive device, the passive device may produce the required electrical values by adjusting the design of the first passive component pattern and the second passive component pattern.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor structure, comprising:
a first layer, comprising a first passive component pattern;
a second layer, spaced apart from the first layer, wherein the second layer comprises a second passive component pattern;
a first interconnection layer, disposed on one side of the first layer facing the second layer, wherein the first interconnection layer comprises a first dielectric material and at least one first interconnect structure electrically connected on the first passive component pattern;
a second interconnection layer, disposed on one side of the second layer facing the first layer, wherein the second interconnection layer comprises a second dielectric material and at least one second interconnect structure electrically connected on the second passive component pattern, wherein the at least one first interconnect structure on the first passive component pattern is hybrid bonded with the at least one second interconnect structure on the second passive component pattern, and a bonding interface between the first interconnection layer and the second interconnection layer, wherein the at least one first interconnect structure is in contact with the at least one second interconnect structure at the bonding interface, and the first dielectric material is in contact with the second dielectric material at the bonding interface.

2. The semiconductor structure according to claim 1, wherein the first passive component pattern and the second passive component pattern are resistance patterns.

3. The semiconductor structure according to claim 1, wherein the first passive component pattern and the second passive component pattern are respectively a first inductance pattern and a second inductance pattern.

4. The semiconductor structure according to claim 3, wherein the first inductance pattern has an input terminal and a first connection terminal, and the second inductance pattern has a second connection terminal and an output terminal, wherein the at least one first interconnect structure is electrically connected to the first connection terminal, the at least one second interconnect structure is electrically connected to the second connection terminal, and the first inductance pattern, the at least one first interconnect structure, the second inductance pattern and the at least one second interconnect structure form a continuous and non-intersecting path between the input terminal and the output terminal and constitute an inductor.

5. The semiconductor structure according to claim 4, wherein the first inductance pattern comprises a first coil spiraling inward from the input terminal to the first connection terminal, and the second inductance pattern comprises a second coil spiraling outward from the second connection terminal to the output terminal.

6. The semiconductor structure according to claim 4, wherein the first inductance pattern comprises a first coil spiraling outward from the input terminal to the first connection terminal, and the second inductance pattern comprises a second coil spiraling inward from the second connection terminal to the output terminal.

7. The semiconductor structure according to claim 1, wherein the number of the at least one first interconnect structure is the same as the number of the at least one second interconnect structure.

8. The semiconductor structure according to claim 1, wherein the at least one first interconnect structure and the at least one second interconnect structure are pads, via contacts, or combinations thereof.

* * * * *